(12) United States Patent
Rehm et al.

(10) Patent No.: US 7,362,632 B2
(45) Date of Patent: Apr. 22, 2008

(54) TEST PARALLELISM INCREASE BY TESTER CONTROLLABLE SWITCHING OF CHIP SELECT GROUPS

(75) Inventors: Norbert Rehm, Apex, NC (US); Rath Ung, Apex, NC (US); Rob Perry, Cary, NC (US); Jan Zieleman, Cary, NC (US); Dirk Fuhrmann, Apex, NC (US)

(73) Assignee: Infineon Technologies AG, Munich (DE)

( * ) Notice: Subject to any disclaimer, the term of this patent is extended or adjusted under 35 U.S.C. 154(b) by 257 days.

(21) Appl. No.: 11/333,037

(22) Filed: Jan. 17, 2006

(65) Prior Publication Data
US 2007/0165469 A1  Jul. 19, 2007

(51) Int. Cl.
G11C 29/00 (2006.01)
G01R 31/02 (2006.01)

(52) U.S. Cl. .................. 365/201; 324/754; 714/718

(58) Field of Classification Search ............. 365/201
See application file for complete search history.

(56) References Cited

U.S. PATENT DOCUMENTS

| 6,449,740 | B1 * | 9/2002 | Yoshie ........................ 714/718 |
| 6,711,042 | B2 * | 3/2004 | Ishikawa ..................... 365/201 |
| 7,106,081 | B2 * | 9/2006 | Mayder et al. ............. 324/758 |

* cited by examiner

*Primary Examiner*—Son L. Mai
(74) *Attorney, Agent, or Firm*—Patterson & Sheridan, L.L.P.

(57) ABSTRACT

Embodiments of the invention generally provide methods and systems for increasing the level of parallelism in testing memory devices. A set of test signals provided by a memory tester may be shared by two or more devices under test. A chip selector may be used to select at least one or all the devices sharing a given set of test signals. By sharing test signals between multiple devices, the level of parallel testing may be increased without increasing the pin count and complexity of memory testers and probe cards.

20 Claims, 9 Drawing Sheets

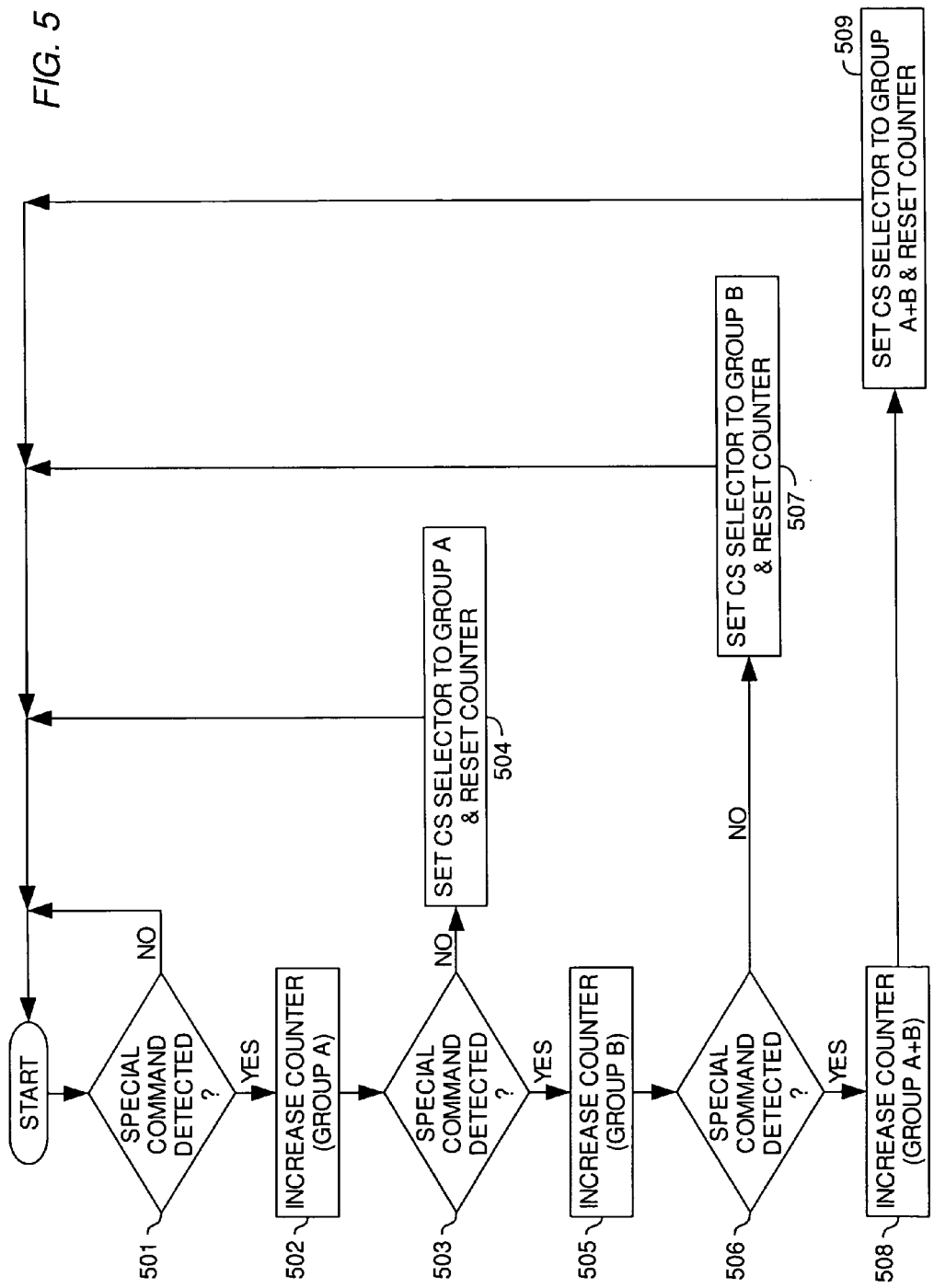

TEST PARALLELISM INCREASE BY TESTER CONTROLLABLE SWITCHING OF CHIP SELECT GROUPS

BACKGROUND OF THE INVENTION

1. Field of the Invention

The invention generally relates to testing a plurality of memory devices in parallel and more specifically to increasing the level of parallelism in testing the memory devices.

2. Description of the Related Art

Testing is a critical step in the production of memory devices. Testing allows for defective products to be identified, repaired or removed from the supply chain, thereby ensuring that only the best quality products are delivered to customers. Testing may also expose design flaws and provide useful yield information which, when fed back into the fabrication process, can improve quality and efficiency of production. Therefore, it is highly desirable to perform testing and to acquire testing data at the earliest possible time.

Memory testing may comprise providing address signals, control signals for commands, power supply, and input/output (I/O) signals. Testing, for example, may involve performing a write operation. The write operation may be performed by first selecting an address location for the write operation by asserting the address along the address lines. The data to be written may then be provided along the data lines to write the data in the selected address location. Thereafter, a read operation may be performed at the address where the write was performed to verify that the data retrieved is indeed the data that was written. To perform the read operation, the address may be asserted again along the address lines and the data on the data lines may be captured. The control signals may be used to indicate the type of command being executed to facilitate communication between devices.

One solution to reducing total testing time and improving throughput is to simultaneously test multiple memory devices in parallel. FIG. 1 illustrates an exemplary parallel testing system 100. The system consists of a memory tester 101, a probe card 102 and one or more devices under test (DUT) 103. Dedicated lines flow from the memory tester 101 to the DUTs 103 through the probe card 102. As illustrated, sets of address, control, I/O, power and chip select lines flow from the memory tester 101 to a respective set of input ports 104 on probe card 102. Each set of input ports 104 is communicable coupled with a set of output ports 105. Each of output ports 105 is coupled with a respective DUT 103. With multiple address, control, I/O, power and chip select lines being provided, multiple devices may be tested in parallel. For example, in system 100 up to four devices may be simultaneously tested, thereby reducing testing time by a factor of four.

However, the increasing density and complexity of modern memory devices has meant longer test times per device and lower test throughput rates. Combating the increasing testing times has typically involved increasing the number of devices being tested in parallel. However, increasing the number of devices tested in parallel has meant increased pin counts and complexity of memory testers and probe cards. This in turn results in increased testing costs.

Therefore, what is needed are systems and methods for increasing the level of parallelism in memory testing in a more efficient manner.

SUMMARY OF THE INVENTION

Embodiments of the invention generally provide methods and systems for increasing the level of parallelism in testing memory devices. A set of test signals provided by a memory tester may be shared by two or more devices under test. A chip selector may be used to select at least one or all the devices sharing a given set of test signals. By sharing test signals between multiple devices, the level of parallel testing may be increased without increasing the pin count and complexity of memory testers and probe cards.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIG. 5 is a flow diagram of operations that may be performed by a chip selector to select one or more memory devices to which it is coupled.

DETAILED DESCRIPTION OF THE PREFERRED EMBODIMENT

Embodiments of the invention generally provide methods and systems for increasing the level of parallelism in testing memory devices. A set of test signals provided by a memory tester may be shared by two or more devices under test. A chip selector may be used to select at least one or all the devices sharing a given set of test signals. By sharing test signals between multiple devices, the level of parallel testing may be increased without increasing the pin count and complexity of memory testers and probe cards.

In the following, reference is made to embodiments of the invention. However, it should be understood that the invention is not limited to specific described embodiments. Instead, any combination of the following features and elements, whether related to different embodiments or not, is contemplated to implement and practice the invention. Furthermore, in various embodiments the invention provides numerous advantages over the prior art. However, although embodiments of the invention may achieve advantages over other possible solutions and/or over the prior art, whether or not a particular advantage is achieved by a given embodiment is not limiting of the invention. Thus, the following aspects, features, embodiments and advantages are merely illustrative and are not considered elements or limitations of the appended claims except where explicitly recited in a claim(s). Likewise, reference to "the invention" shall not be construed as a generalization of any inventive subject matter disclosed herein and shall not be considered to be an element or limitation of the appended claims except where explicitly recited in a claim(s).

SPECIAL PROBE CARD CONFIGURATION

Figure 1:
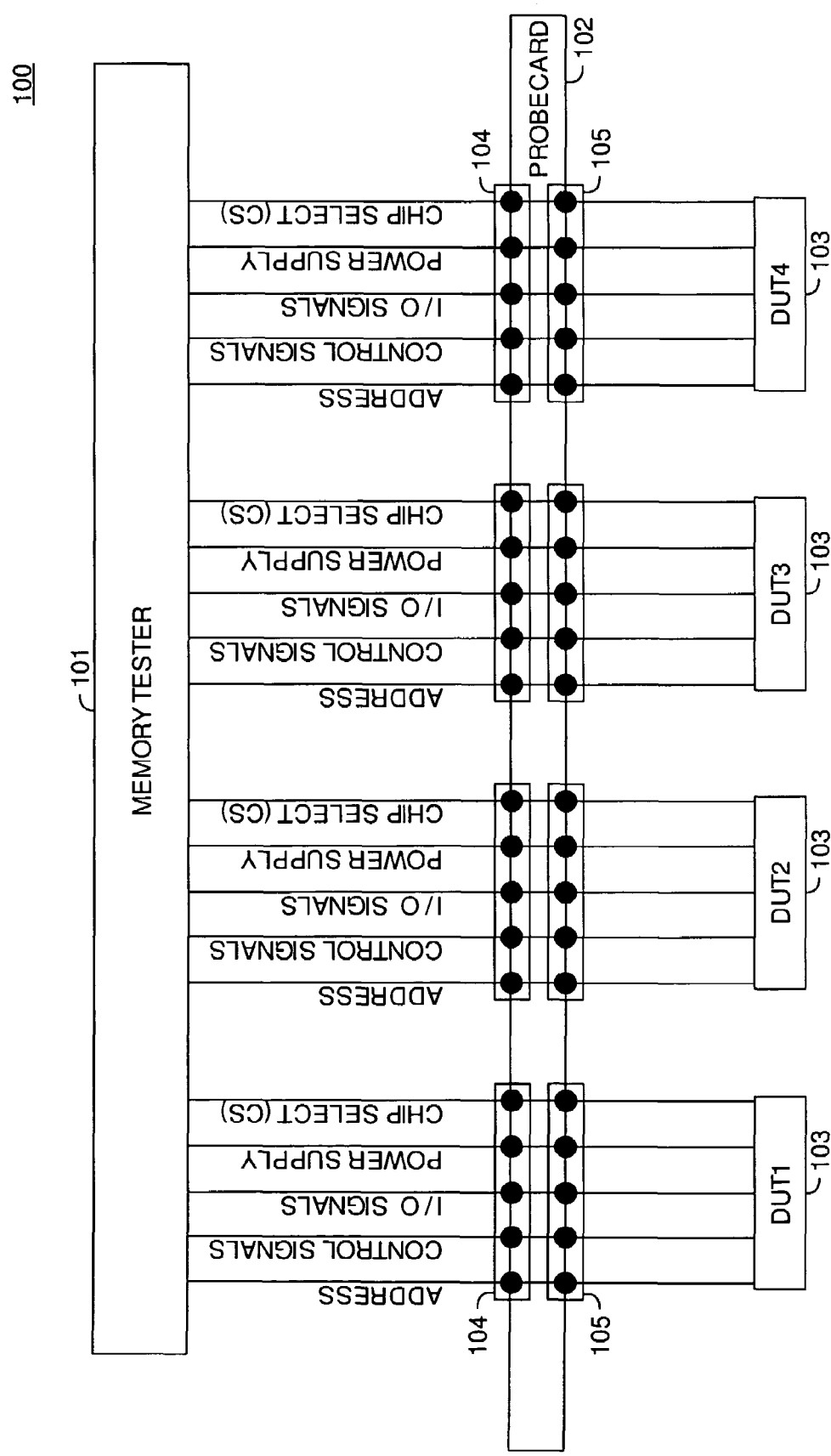
FIG. 1 is an illustration of a parallel memory test system according to the prior art.
Figure 2A:
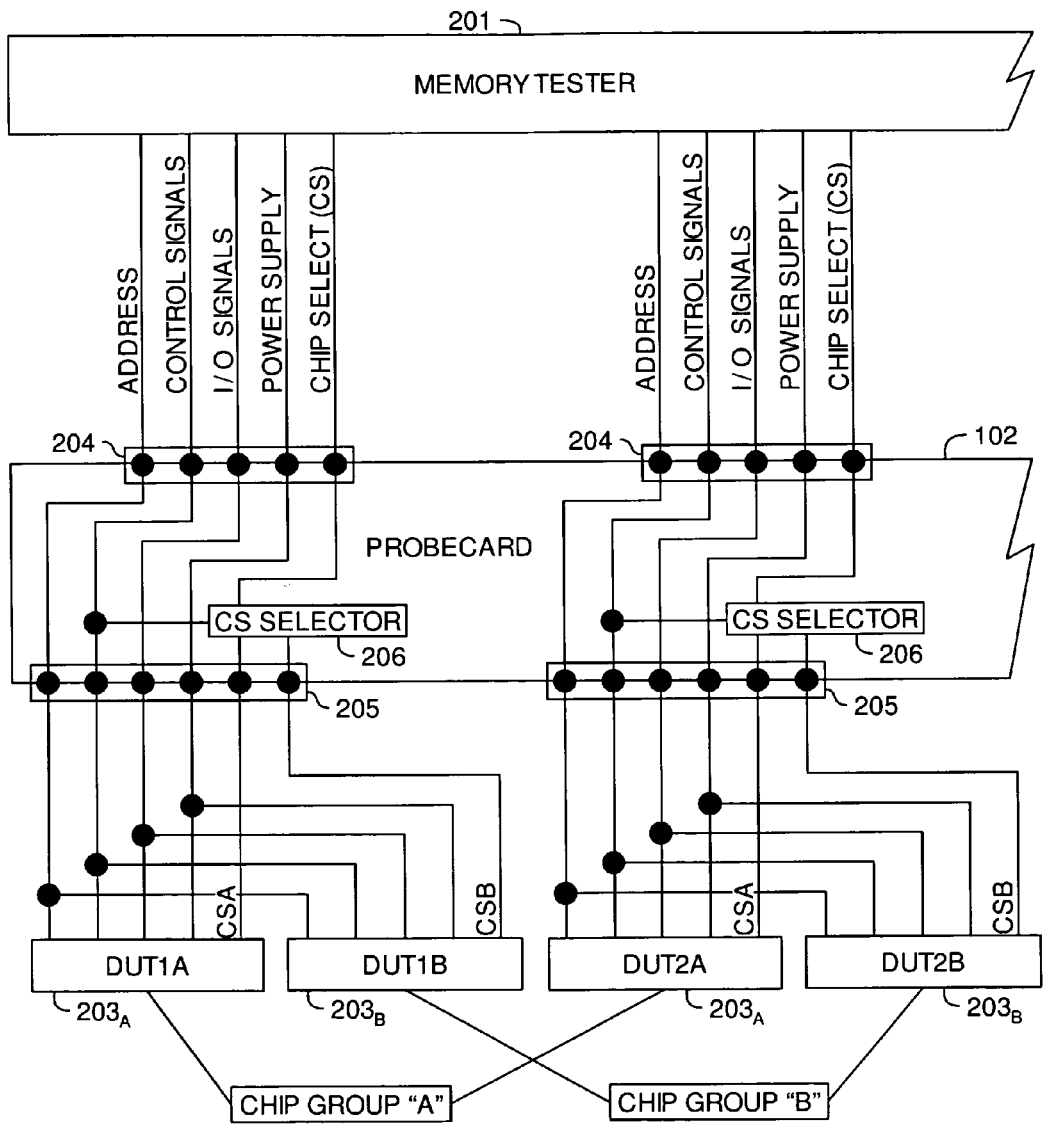
FIG. 2, consisting of FIGS. 2A and 2B, is an illustration of an exemplary test system according to one embodiment of the invention.
Figure 2B:
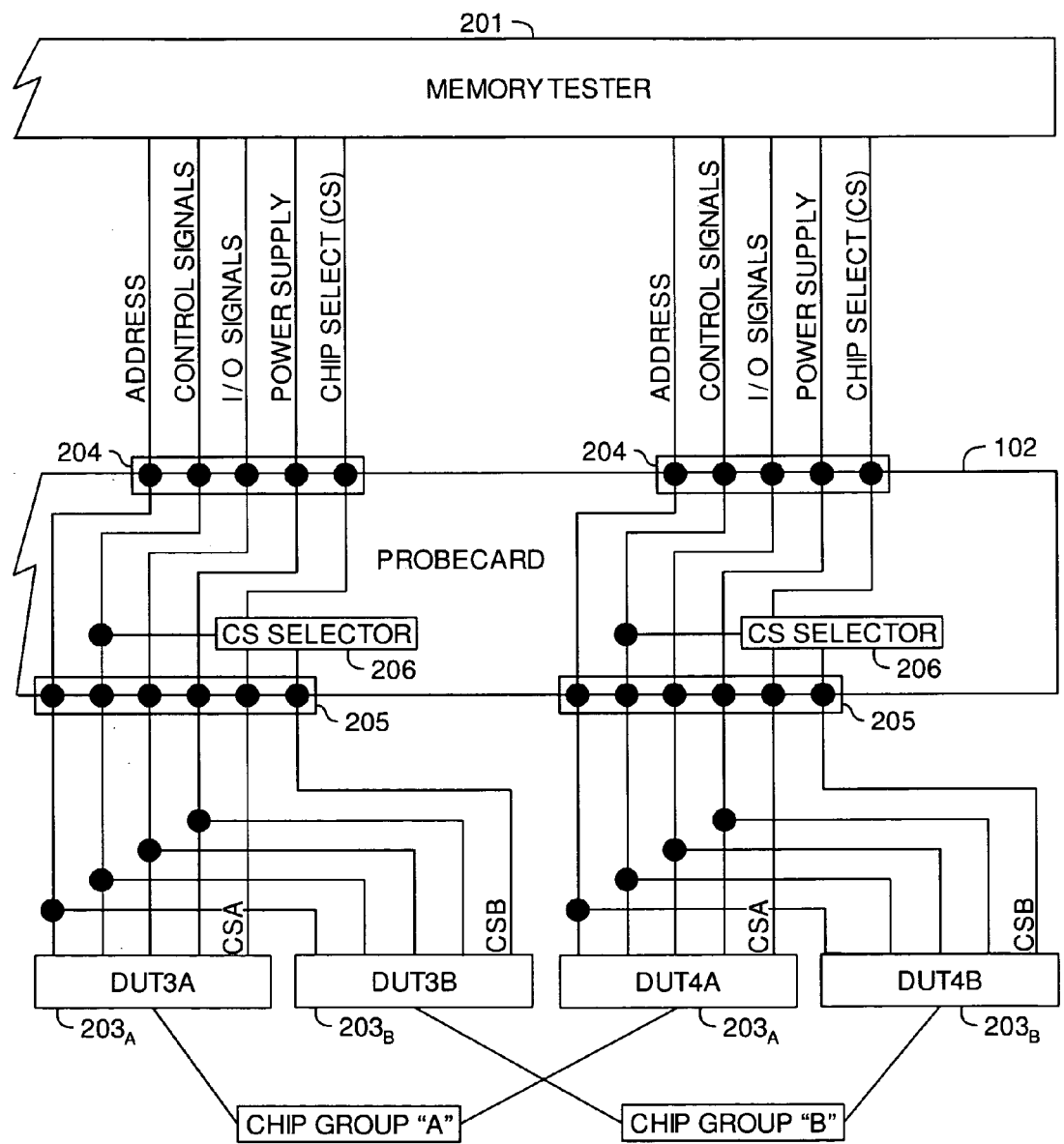

FIG. 2 illustrates an exemplary test system 200 according to one embodiment of the invention. System 200 comprises a memory tester 201, probe card 202 and a plurality of DUT's 203. A plurality of sets of test signals 106 couple the memory tester 201 to a respective set of input ports 204 of probe card 202, as illustrated. Four such input ports 204 are shown. Each set of input ports may comprise ports to receive address, control, I/O, power and chip select signals. While address, control, I/O, power and chip select signal ports are illustrated, one skilled in the art will recognize that any combination of the above mentioned signals or any additional signal ports may be utilized for performing the necessary testing operations.

Each set of input ports 204 may be communicably coupled with a respective set of output ports 205, as illustrated. Each set of output ports 205 may be coupled with two or more devices under test 203. Therefore, the test signals received from the memory tester through a set of input ports 204 may be shared by the two or more DUTs 203 connected to a respective set of output ports 205. Note however, that in the particular embodiment illustrated in FIG. 2, the chip select signal is not shared between parallel devices. While two DUTs 203 are shown connected to each set of output ports 205, one skilled in the art will recognize that any number of DUTs may be connected to each set of output ports 205. The greater the number of devices connected to each output port, the greater may be the level of parallelism achieved. Moreover, the increase in parallelism may be achieved without significant increases in the complexity and pin count of the memory tester or the probe card.

The number of DUTs connected in parallel, for example, may depend on the available power supply. The greater the number of DUTs connected to each set of output ports, the greater may be the need for power to drive all the connected DUTs. Therefore, the selection of the number of DUTs connected in parallel may depend on the availability and cost of power supply to the parallel devices. The number of DUTs connected in parallel may also depend on the size, density and the complexity of the DUTs and the Address Fail Memory available on the memory tester. For example, the address fail memory must be sufficient to record failures of the numerous DUTs connected in parallel. Large, dense and/or complex DUTs may require more address fail memory because the likelihood of failure may be greater.

A chip selector 206 may be associated with each pair of input ports sets 204 and output ports sets 205. The chip selector 206 may receive as an input the chip select signal received from the memory tester 201 in a respective input port in the set of input ports 204. Similarly, the chip select port may also receive as an input the control signals sent by the memory tester. Furthermore, the chip selector may drive device chip select lines connecting the chip selector 206 to each DUT through an associated set of output ports 205. Accordingly, device chip select lines CSa and CSb from the chip selectors to respective devices 203a and 203b are shown in FIG. 2. The number of chip select lines may, for example, depend on the maximum number of DUTs that may be connected to a set of output ports 205.

Figure 3:
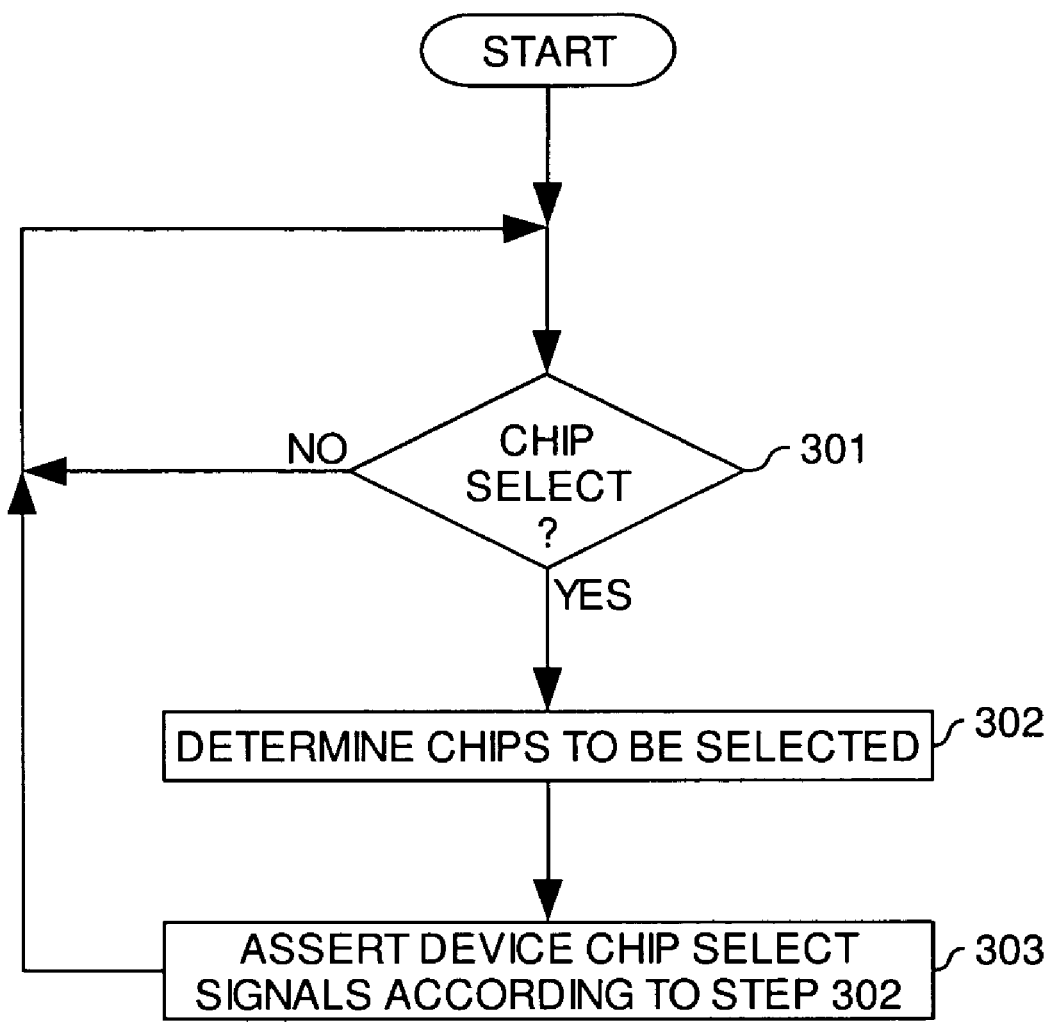
FIG. 3 is a flow diagram of exemplary operations performed to select one or more memory devices connected in parallel.

FIG. 3 illustrates a flow diagram of exemplary operations that may be performed by a chip selector to select one or more devices connected to a set of output ports 205. The operations begin in step 301 by receiving the chip select signal from the memory tester 201. In step 302 the chip selector may determine the specific DUTs to be selected for testing. In one embodiment the chip selector may monitor the command signals sent by the memory tester to determine the specific DUTs to be selected. The programming of the chip selector is described in greater detail below. In response to determining the specific DUTs to be selected, the chip selector may assert the device chip select signals, CSa and CSb for example, to activate the DUTs for testing.

Figure 4:
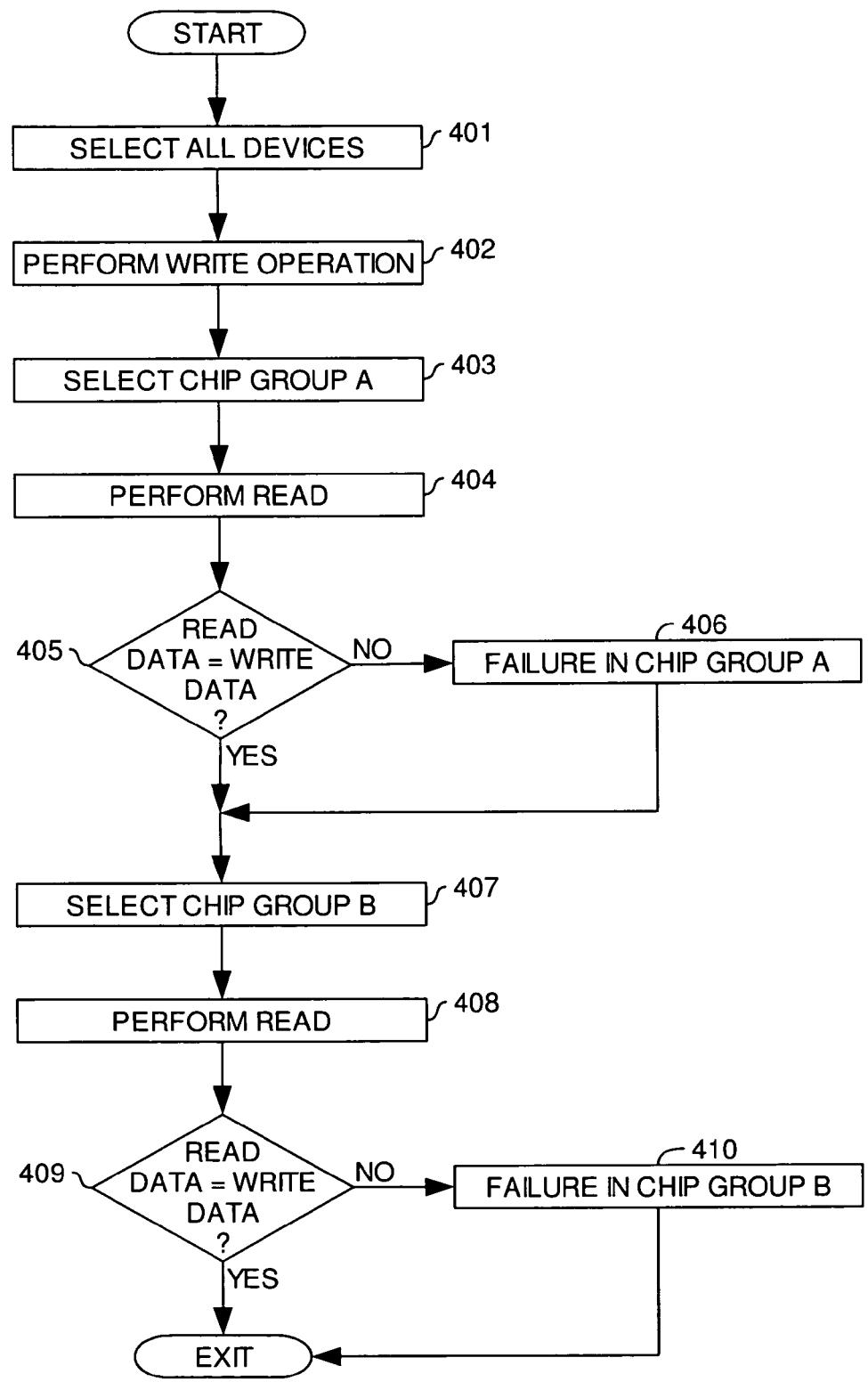
FIG. 4 is a flow diagram of an exemplary test plan.

FIG. 4 is a flow diagram of steps to perform the previously described memory test operations on the DUTs illustrated in FIG. 2. As described earlier the memory test operations may constitute performing a write operation at an address location followed by a read operation at that address location to ensure that the data written is indeed the data retrieved from the read operation. One advantage of the invention is that all DUTs connected to the probe card may be selected at once and a write operation may be performed on all the DUTs in parallel. Therefore, the operations may begin in step 401 by selecting all the DUTs. The memory tester may, for example, assert the chip select signal to each chip selector. Thereafter, the memory tester may assert the appropriate command signals to the chip selectors to indicate that all DUT's connected to the respective set of output ports must be selected. The chip selectors may assert the respective device chip select signals (CSa and CSb for example) in response to the command signals.

In step 402, the memory tester may perform a write operation by asserting data along the data lines of each set of input ports 204. This data may be written to the DUTs through each of the sets of output ports 205.

While it is desirable to perform the write operation in parallel across all devices, the read operation may be performed only on select devices. The read operation may be performed in this manner to facilitate identification of specific devices that are defective. The selection of specific devices may be accomplished by selecting, while reading, specific devices connected to each set of output ports rather than selecting all devices connected in parallel. Accordingly, in step 403, the memory tester may assert the chip select signal to the chip selector and issue commands indicating that only chip group a be selected. In response the chip selector may assert only the CSa signals to activate DUTs 203a.

A read operation may then be performed on DUTs 203a in step 404. In step 405, the read data may be compared to the write data to verify proper functioning of the memory device. In step 406, if the read data is not the same as the data written, a failure may be recorded in the address fail memory of the memory tester identifying the failing DUT. A memory tester may similarly perform a read operation on chip group b by asserting the chip select signal and issuing commands to the chip selectors to select chip group b. Information about failing devices in chip group b may also be recorded in the memory tester. Furthermore, the steps described above may be repeated for various address locations of the DUT.

While a sequence of read and write operation is described herein, one skilled in the art will recognize that any sequence read and write operations may be performed while testing. Moreover, several other types of tests may be run on the device. For example, the DUTs may be subject to a stress test to test the durability of the devices. The selection of specific DUTs under test may be made appropriately according to the particular test plan being implemented.

FIG. 5 is a flow diagram of the programming of a chip selector according to one embodiment of the invention wherein the chip selector determines the devices to be selected based on a sequence of command signals received. The operations begin in step 501 with the chip selector detecting a special command. Upon receipt of the special command, the chip selector may increase a counter maintained by the chip selector. At the first increment of the counter, in step 502, the chip selector may select chip group a. In step 503, if no further special command is detected, the chip selector is set to chip group a. The CSa signal may be asserted and the counter may be reset in step 504. If, on the other hand, a further special command is detected, the counter may be further increased in step 505. If the further special command is not detected in step 506, the chip selector is set to chip group b. The CSb signal may be asserted and the counter may be reset in step 507. If, on the other hand, yet another special command is detected, the counter is further increased and the chip selector may be set to chip groups a and b in step 508. In step 509 the counter may be reset and both CSa and CSb signals asserted to select all DUTs.

As illustrated in FIG. 2, the control signals asserted by the memory tester may be received by both the chip selectors and the DUTs. Therefore, the special command selected may be such that it may only be comprehended by the chip selectors. Because the special command is not understood by the DUTs there is no reaction in the DUTs upon receipt of the special commands.

One skilled in the art will also recognize that an advantage of the present invention is that several different types of memory devices may be tested in parallel. This may be especially useful to manufacturers producing a wide variety of memory products tailored to different customer requirements. The present invention does not require a focused test platform to test memory devices thereby increasing the flexibility and reusability of the test system for diverse product lines. For example, a manufacturer may be able to test a DRAM or flash device along with test wafers simultaneously within the same test system as long as they fall within the operable ranges of memory.

SPECIAL CHIP DESIGN CONFIGURATION

Figure 6A:
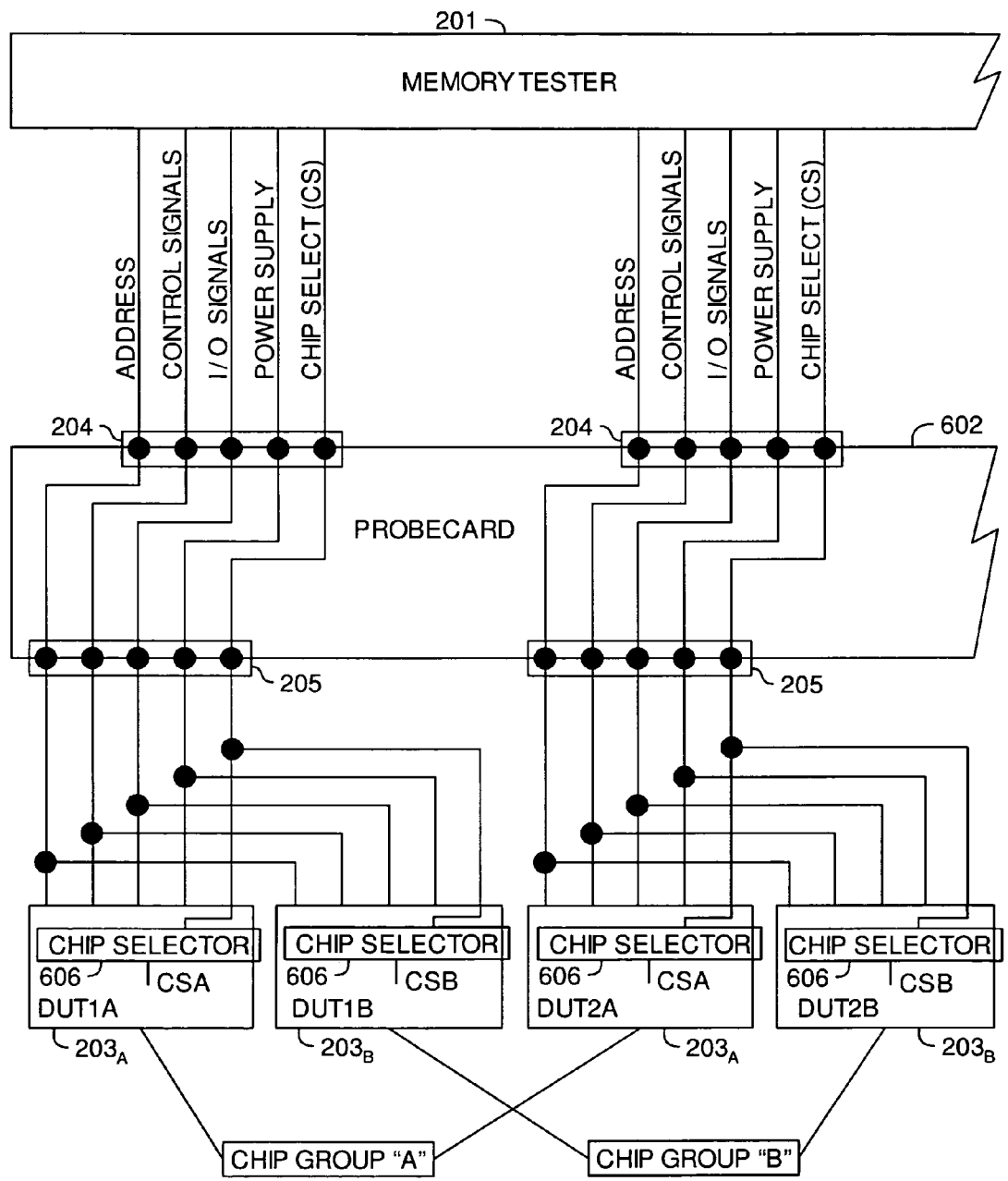
FIG. 6, consisting of FIGS. 6A and 6B, is an illustration of an exemplary test system according to another embodiment of the invention.
Figure 6B:
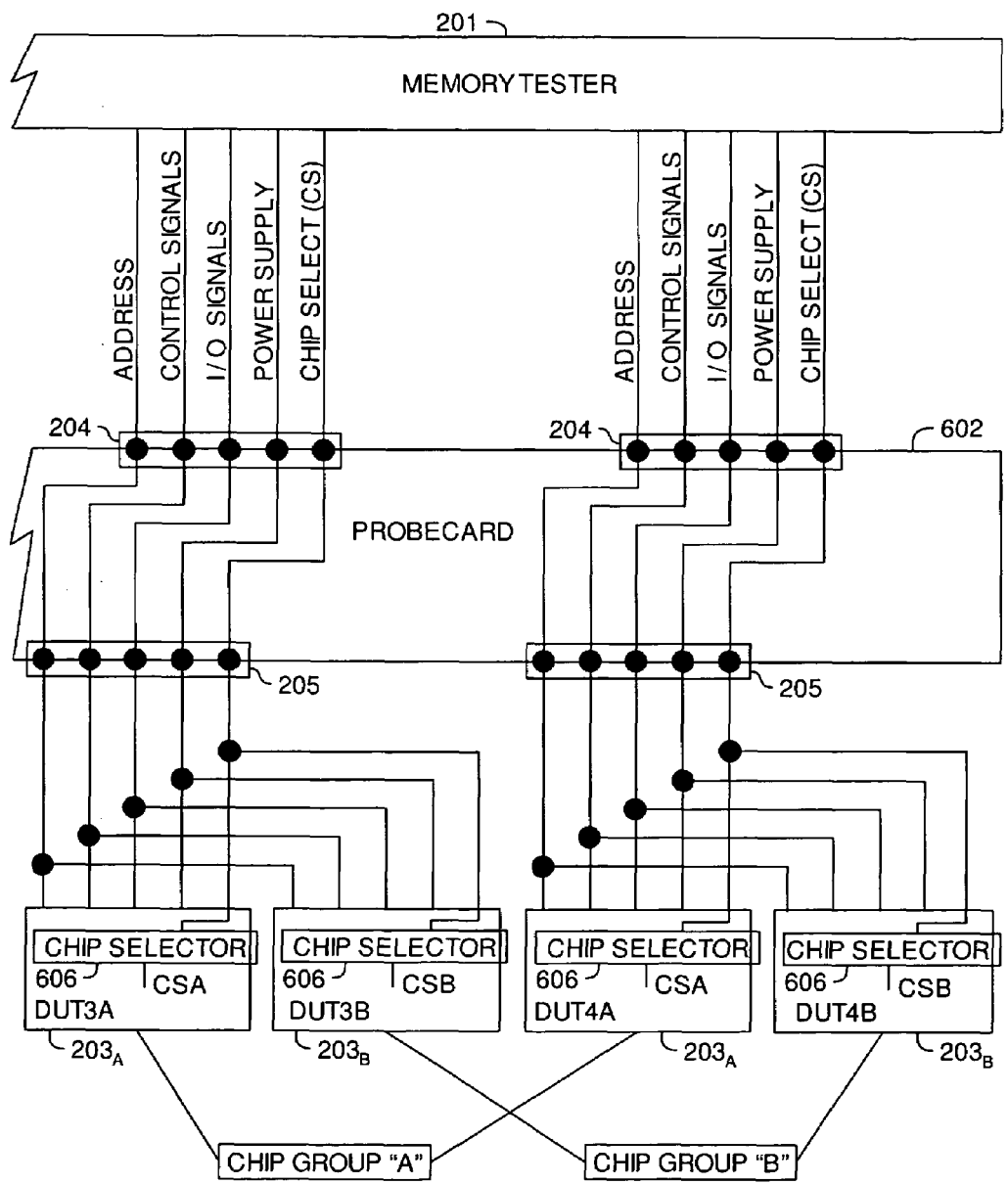

FIG. 6 illustrates an exemplary test system 600 according to another embodiment of the invention. As in system 200, system 600 also contains a memory tester 201, a probe card 602 and a plurality of DUTs 203. Probe card 602, unlike probe card 202, does not contain any chip selectors. Instead the chip selector circuitry is fused on to each of the DUTs, as illustrated in FIG. 6. Therefore, in this embodiment the chip select signal sent by the memory tester is shared between the parallel devices and is routed directly to the DUTs through the probe card 602. The chip select signal is received by the chip selectors contained in the individual DUTs. The chip selector in a particular DUT determines whether the DUT is selected for testing based on the chip select signal, the command signals and on the chip group to which it belongs. The chip groups may be predefined in a wafer prior to testing to facilitate the identification of test modes.

Figure 7:
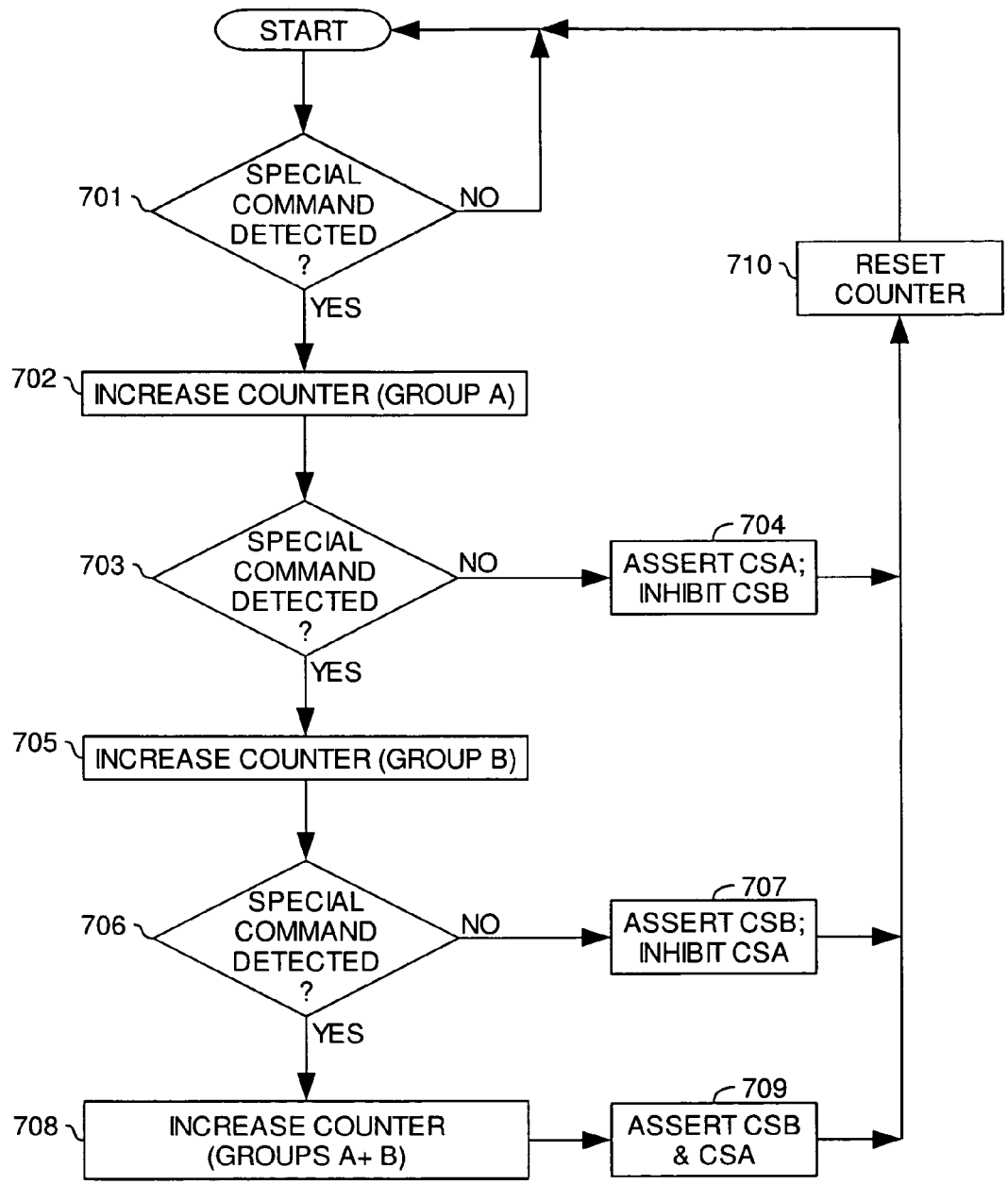
FIG. 7 is a flow diagram of operations that may be performed by a chip selector contained in a memory device to select or deselect the device.

FIG. 7 is a flow diagram of the programming of a chip selector from FIG. 6 according to one embodiment of the invention wherein the chip selector determines whether a respective device is selected based on a sequence of command signals received. The operations begin in step 701 with the chip selector detecting a special command. Upon receipt of the special command, the chip selector may increase a counter maintained by the chip selector. At the first increment of the counter, in step 702, the chip selector may select chip group a. In step 703, if no further special command is detected, and the chip selector is associated with a DUT in group a, CSa is asserted and the device is activated. On the other hand, if the chip selector is associated with a device in group b, CSb is inhibited and the device is not activated. The counter is then reset in step 710.

If, on the other hand, a further special command is detected, the counter may be further increased in step 705. If yet another special command is not detected in step 706, and the chip selector is associated with a DUT in group b, CSb is asserted and the device is activated. On the other hand, if the chip selector is associated with a device in group a, CSa is inhibited and the device is not activated. The counter is then reset in step 710.

If, on the other hand, yet another special command is detected, the counter is further increased and the chip selector may assert the device chip select signal. In this instance the device chip select signal CSa and CSb are both asserted and the grouping of the device may be irrelevant. The counter is then reset in step 710.

CONCLUSION

By allowing two or more DUTs to share the same test signals, embodiments of the present invention increase the level of parallelism in testing memory devices and reduce testing time. Furthermore, the increase in parallelism is achieved without significant increases in pin counts or complexity of memory testers and probe cards.

While the foregoing is directed to embodiments of the present invention, other and further embodiments of the invention may be devised without departing from the basic scope thereof, and the scope thereof is determined by the claims that follow.

What is claimed is:

1. A system for testing a plurality of memory devices, comprising:
   a) a probe card comprising:
      a plurality of sets of input ports, each set of input ports comprising:
         at least two input ports each configured to receive a respective test signal; and
         a chip select port configured to receive a chip select signal;
      a plurality of sets of output ports each communicatively coupled to a respective one of the sets of input ports; each set of output ports comprising:
         at least two output ports communicatively coupled to a respective one of the at least two input ports of the respective set of the input ports; and
   b) a separate chip selector for each set of input ports and respective set of output ports, wherein each chip selector is configured to:
      receive the chip select signal from the respective chip select port;
      receive a command signal via one of the input ports of the respective set of input ports, wherein the command signal is one of the test signals; and in response to the received command signal, issue at least one chip selection signal to select, for testing, at least one of two or more memory devices connected to the set of output ports.

2. The system of claim 1, wherein the chip selection signal is configured to activate the memory device for testing.

3. The system of claim 1, wherein the chip selectors are contained in the probe card, and wherein each chip selector is associated with each pair of the sets of input ports and sets of output ports.

4. The system of claim 1, wherein the chip selectors are configured to:
   receive a succession of command signals; and
   in response to receiving the succession of command signals, select one or more memory devices connected to the set of output ports based on the number of successive command signals received.

5. The system of claim 1, wherein the test signals comprise any combination of:
   address signals;
   data signals;
   input/output signals; and
   control signals.

6. A system for testing a plurality of memory devices, comprising:
   a) a tester for issuing a plurality of test signals and a chip select signal;
   b) a probe card, comprising:
      a plurality of port sets, each set comprising:
         a plurality of input ports each for receiving a respective test signal of the plurality of test signals; wherein one of the plurality of input ports is a command signal port for receiving a command signal;
         a plurality of output ports each communicatively coupled to a respective input port; wherein each port set is communicatively coupled to N memory devices of the plurality of memory devices in parallel, where N>1; and
         a chip select port for receiving the chip select signal;
   c) a separate chip selector for each port set for:
      receiving the respective chip select signal from the respective chip select port;
      receiving the respective command signal via the respective command signal port of the port set, wherein the command signal is one of the test signals; and
      in response to the receiving the command signal, issuing the chip selection signal to select, for testing, one of the N memory devices connected to the output ports of the respective port set;
   wherein the tester is further utilized for altering the command signal to simultaneously select different groups of the plurality of memory devices in order to test the memory devices of each group in parallel, each group comprising one of the N memory devices connected to the respective output ports of the respective port set.

7. The system of claim 6, wherein the chip selectors are contained in the probe card, and wherein each chip selector is associated with each pair of the sets of input ports and sets of output ports.

8. The system of claim 6, wherein the chip selectors are further provided for:
   receiving a succession of command signals; and
   in response to receiving the succession of command signals, selecting one or more memory devices connected to the set of output ports based on the number of successive command signals received.

9. A system for testing a plurality of memory devices, comprising:
   a) a probe card comprising:
      a plurality of sets of input ports, each set of input ports comprising:
         at least two input ports each configured to receive a respective test signal;
      a plurality of sets of output ports each communicatively coupled to a respective one of the sets of input ports; each set of output ports comprising:
         at least two output ports communicatively coupled to a respective one of the at least two input ports of the respective set of the input ports; and
   b) a separate chip selector for each set of input ports and respective set of output ports, wherein each chip selector is configured to:
      receive a command signal via one of the input ports of the respective set of input ports; and
      on the basis of the command signal, selecting a specified memory device; the specified memory device being communicatively connected to one of the output ports.

10. The system of claim 9, wherein each chip selector is further configured to:
    decode the command signal to determine whether the decoded command signal specifies a selection of a memory device to test; and
    if the decoded command signal specifies a selection of a memory device to test; selecting the specified memory device.

11. A method for testing a plurality of memory devices comprising:
    sending, by a memory tester, one or more test signals and a chip select signal to each of one or more sets of input ports of a probe card;
    connecting two or more of the plurality of memory devices to each of one or more sets of output ports of a probe card, wherein the set of output ports is configured to assert the one or more test signals and at least one chip selection signal;
    receiving by a plurality of chip selectors the chip select signal and a command signal, wherein the command signal is one of the test signals;
    in response to receiving the chip select signal and the command signal, asserting, by the chip selector, the at least one chip selection signal to activate at least one of the two or more memory devices connected to the set of output ports; and
    asserting the one or more test signals to test the at least one selected memory device.

12. The method of claim 11, further comprising:
    receiving, by the chip selector, a succession of command signals; and
    asserting the at least one chip selection signal based on the number of successive command signals received.

13. The method of claim 11, wherein the plurality of chip selectors are contained in the probe card, and wherein each chip selector is associated with each set of output ports of the probe card.

14. The method of claim 11, wherein each of the plurality of chip selectors is contained in each of the plurality of memory devices.

15. The method of claim 14, wherein the chip select signal is the chip selection signal.

16. The method claim 11, wherein the test signals comprise any combination of:
   address signals;
   data signals;
   Input/Output signals; and
   Control signals.

17. A system for testing memory devices, comprising:
a) a plurality of memory devices;
b) a probe card, comprising:
   a plurality of port sets, each set comprising:
      a plurality of input ports each configured to receive a respective test signal of a plurality of test signals issued by a tester;
   wherein one of the plurality of input ports is a command signal port configured to receive a command signal;
      a plurality of output ports each communicatively coupled to a respective input port; wherein each port set is communicatively coupled to N memory devices of the plurality of memory devices in parallel, where N>1; and
      a chip select port configured to receive a chip select signal from the tester;
c) a separate chip selector resident on each memory device, wherein the chip selectors associated with a given port set are configured to:
   receive the same chip select signal from the respective chip select port;
   receive the same command signal via the respective command signal port of the port set; and
   in response to the received command signal, select or deselect, for testing, the respective memory device on which the respective chip selector resides; wherein only one of the N memory devices of the given port set is selected for testing at a given time.

18. The system of claim 17, wherein in response to receiving the command signal the chip selector is further configured to assert a chip selection signal, wherein the chip selection signal is configured to activate or deactivate the memory device for testing.

19. The system of claim 17, wherein the chip selectors are configured to:
   receive a succession of command signals; and
   in response to receiving the succession of command signals, select or deselect the memory device.

20. The system of claim 17, wherein the test signals comprise any combination of:
   address signals;
   data signals;
   input/output signals; and
   control signals.

* * * * *